United States Patent
Makhratchev et al.

(10) Patent No.: US 9,299,539 B2
(45) Date of Patent: Mar. 29, 2016

(54) METHOD AND APPARATUS FOR MEASURING WAFER BIAS POTENTIAL

(75) Inventors: Konstantin Makhratchev, Freemont, CA (US); John Valcore, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 1443 days.

(21) Appl. No.: 12/545,293

(22) Filed: Aug. 21, 2009

(65) Prior Publication Data

US 2011/0043228 A1 Feb. 24, 2011

(51) Int. Cl.
*G01R 19/00* (2006.01)
*G01R 27/08* (2006.01)
*H01J 37/32* (2006.01)

(52) U.S. Cl.
CPC ..... *H01J 37/32642* (2013.01); *H01J 37/32935* (2013.01)

(58) Field of Classification Search
CPC ............. H01J 37/32642; H01J 37/32568; H01J 37/32495; H01J 37/32174; H01J 37/32715; H01J 37/32577; H01J 2237/03; H01J 37/32917
USPC ........................ 324/754.24, 754.27, 750.26
See application file for complete search history.

(56) References Cited

U.S. PATENT DOCUMENTS

| | | | |
|---|---|---|---|
| 5,557,215 A | 9/1996 | Saeki et al. | |
| 5,737,177 A | 4/1998 | Mett et al. | |
| 5,748,434 A * | 5/1998 | Rossman et al. | 361/234 |
| 5,942,889 A | 8/1999 | Loewenhardt et al. | |
| 6,036,877 A * | 3/2000 | Collins et al. | 216/68 |
| 6,042,686 A * | 3/2000 | Dible et al. | 156/345.44 |
| 6,215,640 B1 * | 4/2001 | Hausmann | 361/234 |
| 6,475,336 B1 | 11/2002 | Hubacek | |
| 6,517,670 B2 * | 2/2003 | Okumura et al. | 156/345.28 |
| 6,649,021 B2 * | 11/2003 | Ohmoto et al. | 156/345.43 |
| 6,689,249 B2 * | 2/2004 | Ke et al. | 156/345.3 |
| 6,780,278 B2 * | 8/2004 | Hayashi et al. | 156/345.47 |
| 6,856,147 B2 * | 2/2005 | Zarkhin et al. | 324/693 |
| 7,064,812 B2 * | 6/2006 | Ludviksson et al. | 356/72 |
| 7,115,169 B2 * | 10/2006 | Nguyen | 118/721 |
| 7,165,321 B2 * | 1/2007 | Kondo et al. | 29/832 |
| 7,658,816 B2 * | 2/2010 | Koshiishi et al. | 156/345.43 |
| 7,728,613 B2 * | 6/2010 | Blaney et al. | 324/754.07 |
| 2001/0025691 A1 | 10/2001 | Kanno | |

(Continued)

FOREIGN PATENT DOCUMENTS

| | | |
|---|---|---|
| JP | 2002/270577 | 9/2002 |
| JP | 2005-310945 | 11/2005 |

(Continued)

OTHER PUBLICATIONS

Cecile Chatel, International Preliminary Report on Patentability, PCT/IB2010/053735, Mar. 1, 2012.

*Primary Examiner* — Vinh Nguyen
(74) *Attorney, Agent, or Firm* — Beyer Law Group LLP

(57) ABSTRACT

A device for use in a wafer processing chamber having a plasma forming volume and a hot edge ring. The hot edge ring has a first surface and a second surface. The first surface is in contact with the plasma forming volume. The second surface is not in contact with the plasma forming volume. The device includes a detector operable to contact the second surface of the hot edge ring. The detector can detect a parameter of the hot edge ring and can provide a detected signal based on the detected parameter.

7 Claims, 9 Drawing Sheets

(56) References Cited

U.S. PATENT DOCUMENTS

| | | |
|---|---|---|
| 2001/0050143 A1 | 12/2001 | Crocker |
| 2002/0007914 A1 | 1/2002 | Okumura et al. |
| 2007/0193976 A1 | 8/2007 | Tamura et al. |
| 2009/0242127 A1* | 10/2009 | Koshimizu et al. ...... 156/345.28 |
| 2010/0018648 A1* | 1/2010 | Collins et al. ............ 156/345.24 |

FOREIGN PATENT DOCUMENTS

| | | |
|---|---|---|
| KR | 10-2009-0049187 | 5/2009 |
| TW | 421824 | 2/2001 |
| WO | 2009-006038 | 1/2009 |

\* cited by examiner

METHOD AND APPARATUS FOR MEASURING WAFER BIAS POTENTIAL

BACKGROUND

The present invention relates to wafer processing chambers. More particularly, the present invention relates to an apparatus for measuring the DC bias potential of a wafer during plasma processing.

In conventional wafer processing systems, it is common to affix the wafer to the lower electrode pedestal with an electrostatic attraction force provided by an electrostatic chuck (ESC). Electrostatic chucking is commonly implemented by providing a conductive film between two insulation films located on the upper surface of the pedestal. Once a semiconductor wafer is affixed to the ESC, the wafer may be processed.

In the conventional production of semiconductor integrated circuits, plasma is used to promote ionization of a process gas for etching, chemical vapor deposition or sputtering a wafer. In a conventional capacitive plasma processing system, upper and lower electrodes, e.g., large area parallel plates, are provided in a pressure-controlled process chamber with the electrodes facing each other.

In this plasma processing system, the electrode located at the top or upper portion of the chamber, is connected to ground potential, and a high-frequency voltage is applied to the electrode at the bottom or lower portion of the chamber. The lower electrode also serves as a pedestal. A process gas is converted into plasma by the electrical discharge between the upper and lower electrodes.

Strong electric field regions are produced between the electrodes and the plasma. These strong electric field regions are referred to as plasma sheaths. The strong electrical field regions accelerate the electrons and ions from the electrodes to the plasma and vice-versa.

Electrons and ions in the plasma are attracted to a semiconductor wafer residing on the pedestal by the force of an electric field. The ions react with the surface of the semiconductor.

In a conventional plasma processing apparatus, a high-frequency voltage is applied to the lower electrode by a capacitor, and as a result a high-frequency voltage is also applied to the wafer located on the pedestal. This configuration generates a substantially negative DC voltage potential on the pedestal and the wafer. The negative DC voltage potentials are commonly referred to as DC bias potentials.

During the half cycle when the high-frequency voltage is positive, negatively charged electrons in the plasma are attracted to the wafer, whereas during the other half cycle when the high-frequency voltage is negative, positively charged ions in the plasma are attracted to the wafer.

Since an electron has a smaller weight than that of an ion, electrons are more easily transferred to the wafer than the ions are. Consequently, the wafer becomes negatively charged, as more electrons are attracted to the wafer than ions. Thus, the wafer develops a substantially negative DC bias potential.

The DC bias potential increases the energy of the ion presented to the wafer and consequently alters the effectiveness of the wafer processing system. Excessively large bias voltages in the range of 400V to 500V can damage the oxide film on the surface of a wafer. Hence it is crucial in wafer processing systems to be able to monitor and control the DC bias potential of the wafer, or wafer potential. Direct measurement of wafer potential is very difficult. It is virtually impossible to attach or connect a probe to the wafer for direct measurement of the wafer potential, as probes are incapable of withstanding the harsh environment surrounding the wafer.

Several conventional methods have been developed for estimating the wafer potential in a semiconductor processing system. While these conventional methods are capable of providing an estimate of the wafer potential, each method has issues with respect to accuracy, longevity, maintenance, configuration and/or potential for errors.

One convention method for estimating wafer potential uses a probe located within the chamber wall of the plasma processing system. Such a conventional method will now be described with reference to FIG. 1.

FIG. 1 illustrates an example of a conventional wafer processing system 100. As illustrated, wafer processing system 100 includes a communication channel 104, a user interface 106, a 2 MHz RF generator 110, a 27 MHz RF generator 112, a 60 MHz RF generator 114, an impedance matching circuit 116, an ESC 118, an ESC base plate 120, a wafer processing chamber 122, a ceramic coupling ring 126, a hot edge ring (HER) 128, a voltage measuring instrument 130, and a probe 132.

A wafer 102 resides on and is clamped to ESC 118 by an electrostatic attraction force. HER 128 surrounds ESC 118 and provides a uniform etch rate and reduced etch rate drift near the edge of wafer 102. Ceramic coupling ring 126 surrounds ESC 118 and is located beneath HER 128. ESC base plate 120 is located beneath ESC 118 and ceramic coupling ring 126.

Impedance matching circuit 116 receives driving signals from 2 MHz RF generator 110, 27 MHz RF generator 112 and 60 MHz RF generator 114 and provides an appropriate RF signal 124 to ESC base plate 120. Impedance matching circuit 116 is configured such that its impedance is the complex conjugate of the impedance of wafer processing chamber 122, thus minimizing reflected energy and enabling maximum RF energy transfer of the signals provided by 2 MHz RF generator 110, 27 MHz RF generator 112 and 60 MHz RF generator to wafer processing chamber 122.

A plasma 108 is generated above wafer 102 as a result of the RF energy supplied by RF signal 124. Plasma 108 is used to convert or process wafer 102 by bombarding wafer 102 with positively charged ions. A plasma sheath 136 is located between plasma 108 and wafer 102, HER 128. Positively charged ions are propelled across plasma sheath 136 due to a strong electric field region located between plasma 108 and wafer 102, HER 128.

Information related to the status of wafer processing chamber 122 is communicated to user interface 106 by communication channel 104. Further, a user (not shown) is operable to control 2 MHz RF generator 110, 27 MHz RF generator 112 and 60 MHz RF generator 114, by way of user interface 106 and communication channel 136.

Probe 132 is fabricated from electrically conductive material and is attached to the side of wafer processing chamber 122. An electrical conductor 134 is attached to probe 132 and exits wafer processing chamber 122 and connects to voltage measuring instrument 130. Voltage measuring instrument 130 is capable of measuring either AC (peak-to-peak) or DC (bias level) voltages.

Voltage measuring instrument 130 measures the potential of wafer 102.

In conventional wafer processing system 100, probe 132 does not directly contact wafer 102 or plasma sheath 136 and is prone to errors in the measurement of the potential of wafer 102 as presented to voltage measuring instrument 130. Additionally, for configurations of wafer processing system 100 using multi-frequency driven plasma, the errors in the estimated potential for wafer 102 are especially pronounced during complex load transitions. This method for processing wafers can be difficult to calibrate and configure as a result of the complex load transition errors which occur in the estimated potential of wafer 102.

Another conventional method for estimating the wafer potential is by providing electrodes located about the periphery of the ESC, which are in contact with the wafer. The electrodes are commonly constructed of silicon carbide probes. Unfortunately, the use of these electrodes produces contaminants within the process chamber, as the electrodes are erroded by the plasma. This contamination negatively impacts the effectiveness of the plasma by reducing the plasma etch rate. Additionally, the electrodes are consumable and must frequently be replaced requiring significant time, effort and cost.

FIG. 2 illustrates an example of a conventional wafer processing system 200. Wafer processing system 200 contains several common elements wafer processing system 100 of FIG. 1. However, probe 132 and electrical conductor 134 of wafer processing system 100 are replaced with a probe 202 and an electrical conductor 204 in wafer processing system 200. As illustrated in FIG. 2, an upper end of a probe 202 contacts the underside of wafer 102 through a cavity 206 provided through ESC base plate 120, ESC 118 and HER 128. Lower end of probe 202 connects to electrical conductor 204. Electrical conductor 204 connects to voltage measuring instrument 130.

Probe 202 is commonly constructed of a silicon carbide pin. The potential of wafer 102 is detected by probe 202 and transferred to voltage measuring instrument 130. Voltage measuring instrument 130 is then capable of measuring AC (peak-to-peak) or DC (bias level) voltages of wafer 102.

While wafer processing system 200 enables accurate measurement of the potential of wafer 102, it causes contaminants to be projected into the processing chamber from the consumption of probe 202 during wafer processing. These contaminates negatively impact the effectiveness of the plasma by reducing the plasma etch rate. Additionally, the electrodes are consumable and must frequently be replaced requiring significant time, effort and cost.

Another conventional method for measuring the wafer potential is performed by varying the DC voltage applied to the electrostatic chucking electrode and measuring the leakage current between the wafer and the electrostatic chucking electrode. The measured leakage current is then used to estimate the wafer potential.

While the leakage current measurement method for estimating the wafer potential provides a capable wafer processing system, the method is highly dependant upon the magnitude of the leakage current. The magnitude of the leakage current can vary significantly depending upon the configuration of the plasma processing system. Hence, the ESC leakage current detection method for estimating the wafer potential requires considerable time, effort and cost for calibration and configuration.

Unfortunately, conventional methods for measuring the wafer potential are inaccurate, have short lifetimes, are prone to errors and require significant effort for maintenance and configuration. What is needed is a method for measuring the wafer potential that is accurate, has a prolonged lifetime, is not prone to errors and does not require a significant amount of effort for maintenance and configuration.

BRIEF SUMMARY

It is an object of the present invention to provide an apparatus for measuring the wafer potential located in a plasma processing system that is accurate, provides a sustained lifetime, is not prone to errors and provides for ease of maintenance and configuration.

An aspect of the present invention includes a device for use in a wafer processing chamber having a plasma forming volume and a hot edge ring. The hot edge ring has a first surface and a second surface. The first surface is in contact with the plasma forming volume. The second surface is not in contact with the plasma forming volume. The device includes a detector operable to contact the second surface of the hot edge ring. The detector can detect a parameter of the hot edge ring and can provide a detected signal based on the detected parameter.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

Figure 1:
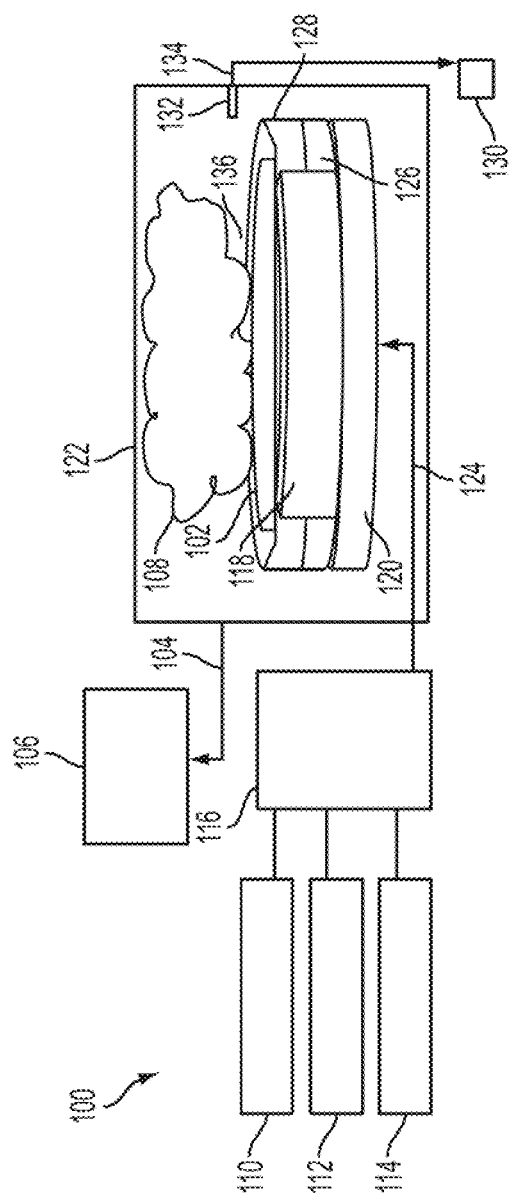
FIG. 1 illustrates an example of a conventional wafer processing system.
Figure 2:
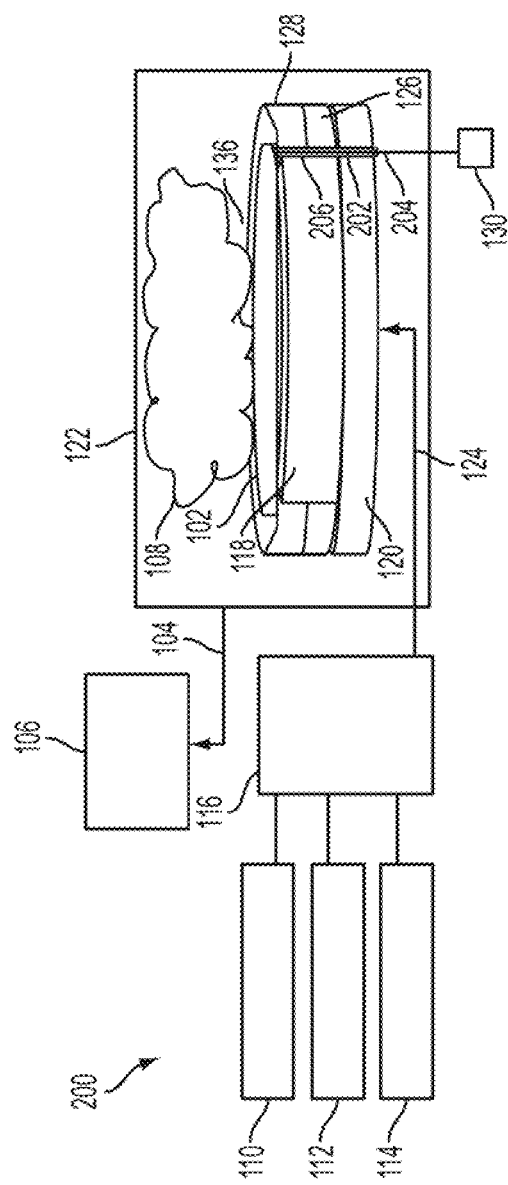
FIG. 2 illustrates another example of a conventional wafer processing system.

In accordance with an aspect of the present invention, an HER is used as a plasma sheath voltage transducer to monitor wafer potential in a wafer processing system. Accordingly, in accordance with an aspect of the present invention, voltage probe is not exposed to the plasma as with conventional systems discussed above with reference to FIGS. 1 and 2.

Aspects of the present inventions will now be described with reference to FIGS. 3-10B.

Figure 3:
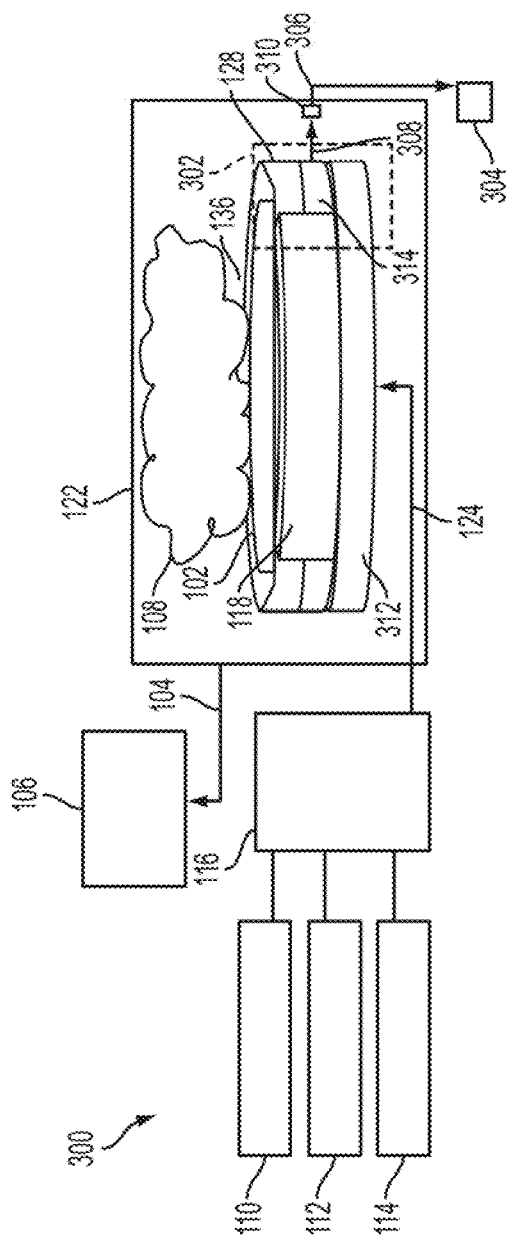
FIG. 3 illustrates an example of a wafer processing system in accordance with an aspect of the present invention.

FIG. 3 illustrates an example of a wafer processing system 300 in accordance with an aspect of the present invention. Wafer processing system 300 contains several common elements wafer processing system 200 of FIG. 2. However, wafer processing system 300 does not include probe 202 and electrical conductor 204. Wafer processing system 300 further includes a signal conditioner 310 and a processor 304. Additionally, ESC base plate 120 and ceramic coupling ring 126 of wafer processing system 200 have been replaced with an ESC base plate 312 and a ceramic coupling ring 314 in wafer processing system 300.

ESC base plate 312 and ceramic coupling ring 314 enable generation and transmission of an electrical signal 308. Electrical signal 308 exits ceramic coupling ring 314 and is transmitted from wafer processing chamber 122 to signal conditioner 310. Signal conditioner 310 includes circuitry for filtering the RF signal from electrical signal 308 to provide a DC bias potential 306, which is a representation of the potential of wafer 102.

DC bias potential 306 is useful for plasma tool process monitoring, process end point detection and detection of significant process events. DC bias potential 306 is transmitted to processor 304. Processor 304 monitors DC bias potential 306 to verify the proper processing of wafer 102 and to monitor for error conditions within wafer processing chamber 122. Processor 304 enables a user to monitor the operation of wafer processing chamber 122 and determine if an error condition has occurred.

A cutout 302 is provided in order to detail an embodiment of the present invention located within the cutout area, and will be described below with reference to FIG. 4.

Figure 4:
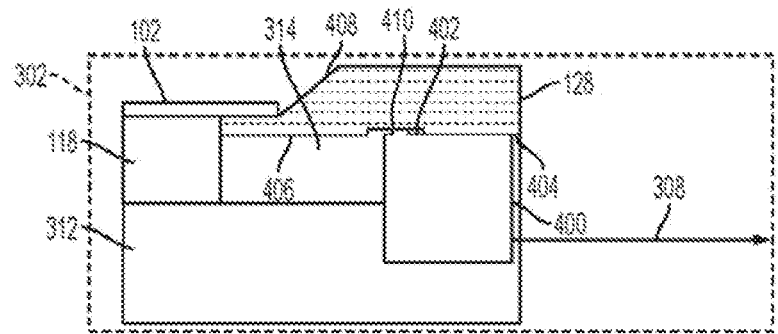
FIG. 4 is a cross-sectional view of a portion of FIG. 3.

FIG. 4 is a cross-sectional view of cutout 302 as illustrated in FIG. 3. HER 128 has a bottom surface 404 and a slanted surface 408. Ceramic coupling ring 314 has a top surface 406. Bottom surface 404 of HER 128 rests on top surface 406 of ceramic coupling ring 314. Slanted surface 408 is located on the inner diameter of HER 128 and is exposed to plasma during wafer processing. Wafer 102 is disposed upon ESC 118 and resides close to slanted surface 408 of HER 128. Slanted surface 408 of HER 128 is provided in order to aid in positioning wafer 102 and also for beneficial shaping of plasma 108 near the edge of wafer 102.

As illustrated in the figure, a signal detector 400 resides in a space 402 within ESC base plate 312 and ceramic coupling ring 314. A hole 410 extends from space 402 to top surface 406 of ceramic coupling ring 314. Signal detector 400 is in electrical contact with HER 128 through hole 410 and produces electrical signal 308. Accordingly, HER 128 serves as a probe to measure wafer potential.

The aspect of using HER 128 as a probe to measure wafer potential is best explained by: first showing that the plasma potential as measured by a probe 202 is linearly related to the wafer potential as measured by a wired wafer; then by discussing that HER 128 being used as a probe to measure the plasma potential is linearly related to the plasma potential as measured by a probe 202; and then experimentally verifying that HER 128 may be used as a probe to measure the wafer potential.

Returning to FIG. 2, it has been determined that the plasma potential as measured by probe 202 is linearly related to the wafer potential as measured by a wired wafer.

Figure 5:
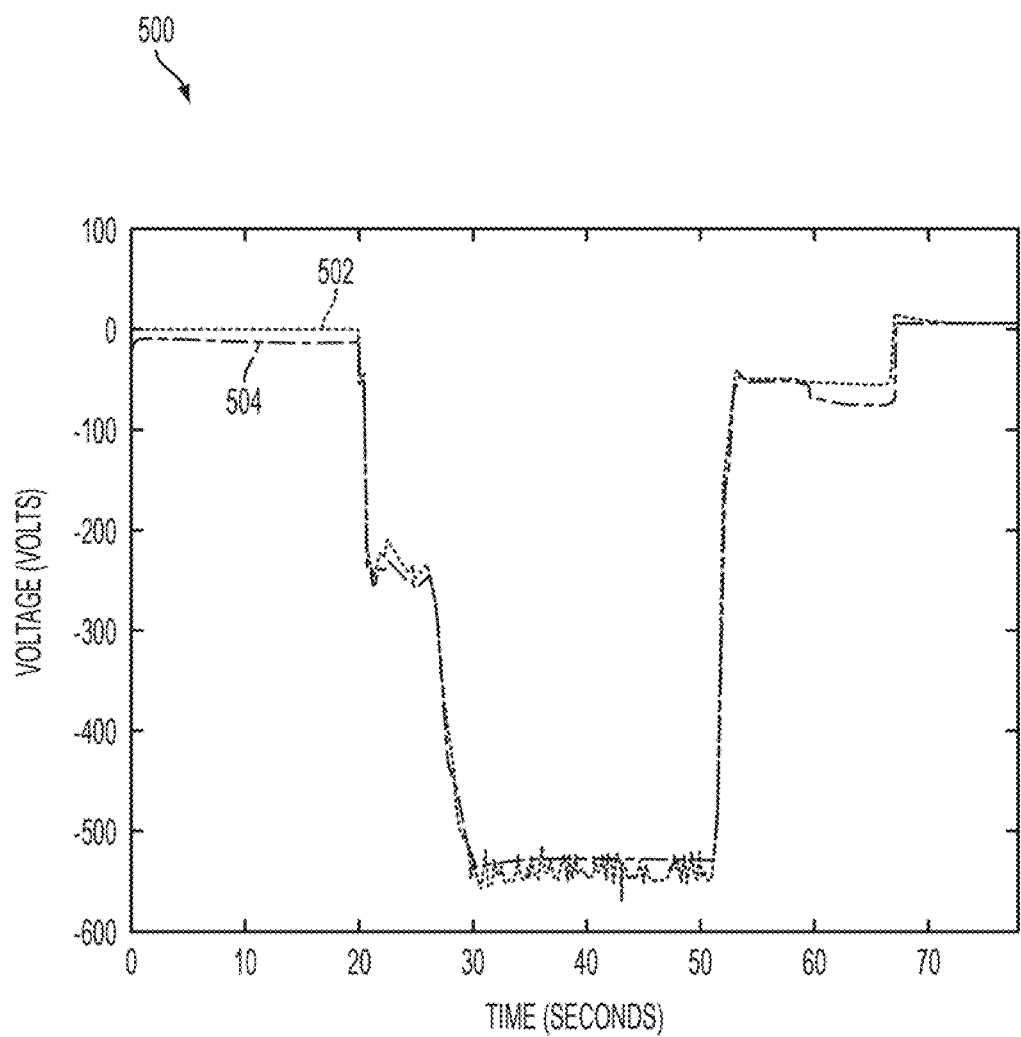
FIG. 5 is a graph comparing plasma potential measured by a probe with wafer potential measured by a wired wafer.

FIG. 5 is a graph 500 comparing plasma potential as measured by probe 202 with a wafer potential as measured by a wired wafer. For wafer potential as measured by a wired wafer, a probe was placed in contact with the top or upper surface of a wafer. For both measurements, the signals derived from the probes were filtered to remove RF components. After applying the RF filter, the signals contained only the DC voltage.

In graph 500, the x-axis is time (in seconds), whereas the y-axis is measured voltage (in volts). A dotted line 502 corresponds to the plasma potential as measured by probe 202, whereas a dashed line 504 corresponds to the wafer potential as measured by a wired wafer.

As illustrated in graph 500, dotted line 502 and dashed line 504 are very similar. Based on the similar behavior of dotted line 502 and dashed line 504, it is determined the measurement of the plasma potential by probe 202 is an accurate representation of the wafer potential.

Figure 6:
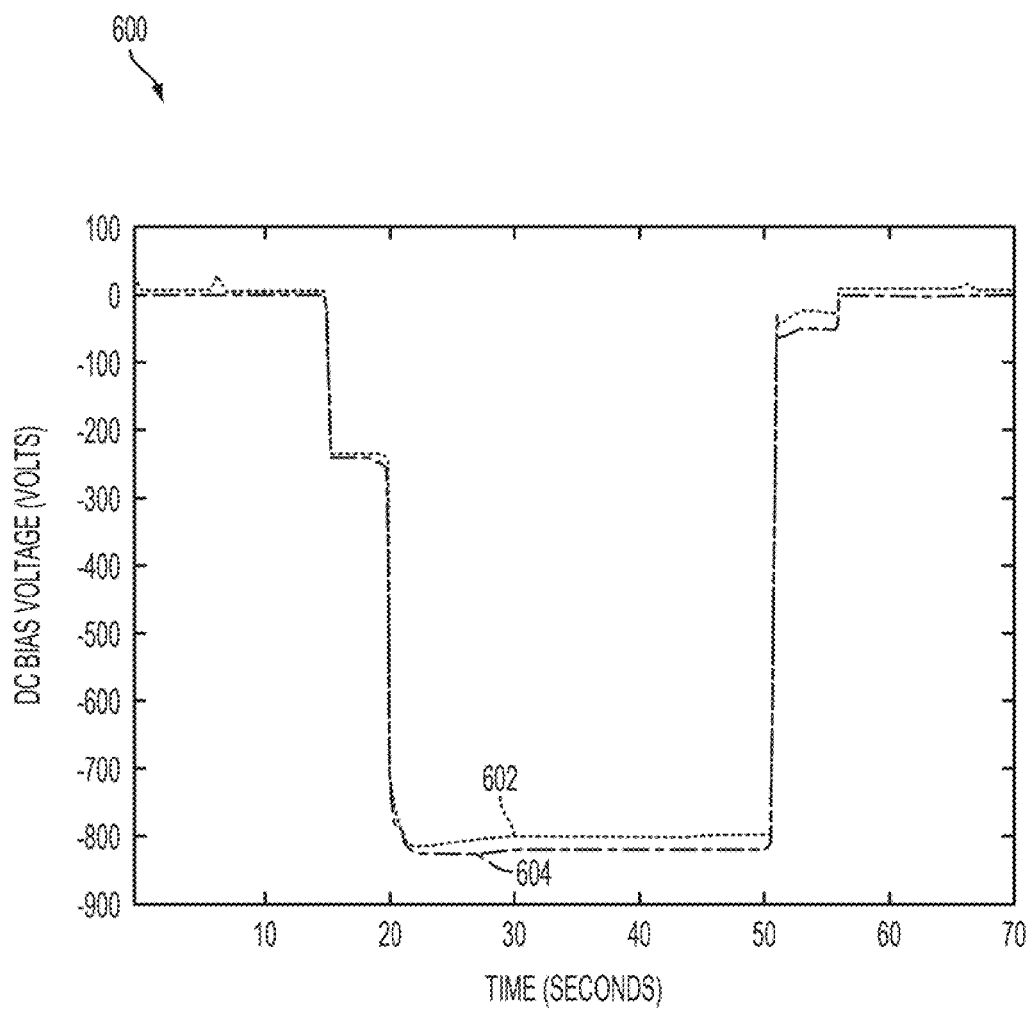
FIG. 6 is a graph comparing plasma potential as measured by a probe with the potential of a wafer as measured using an HER in accordance with an aspect of the present invention.

FIG. 6 is a graph 600 comparing plasma potential as measured by probe 202 with the potential of wafer 102 as measured using HER 128 in accordance with an aspect of the present invention.

In graph 600, the x-axis is time (in seconds), whereas the y-axis is measured voltage (in volts). A dotted line 602 corresponds to the plasma potential as measured by probe 202, whereas a dashed line 604 corresponds to the potential of wafer 102 as measured using HER 128 in accordance with an aspect of the present invention.

As illustrated in graph 600, dotted line 602 and dashed line 604 are very similar. Based on the similarity of dotted line 602 and dashed line 604, it is determined the measurement of the potential of wafer 102 by HER 128 accurately represents the plasma potential as measured by probe 202.

As discussed above with reference to FIG. 5, the measurement of the plasma potential by probe 202 is an accurate representation of the wafer potential. Further, as discussed above with reference to FIG. 6, the measurement of the potential of wafer 102 by HER 128 is an accurate representation of the plasma potential as measured by probe 202. Therefore, the measurement of the potential of wafer 102 by HER 128 is an accurate representation of the wafer potential.

Returning to FIG. 4, since it has been determined that the potential of wafer 102 as measured by HER 128 is an accurate representation of the wafer potential, signal detector 400 determines the potential of wafer 102, by measuring the potential of HER 128.

Example embodiments of signal detector 400 will now be described with reference to FIGS. 7-10B.

Figure 7:
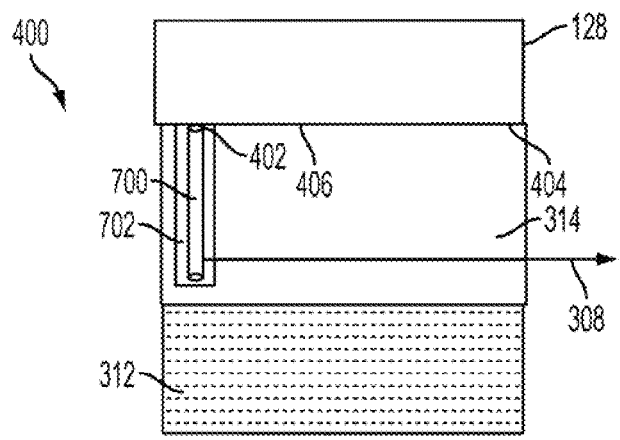
FIG. 7 illustrates an example embodiment of a signal detector in accordance with an aspect of the present invention.

FIG. 7 illustrates an example embodiment of signal detector 400 in accordance with an aspect of the present invention.

In this example embodiment, signal detector 400 includes an electrical contact 700 and is disposed within a cavity 702. An upper end of electrical contact 700 is disposed at hole 410, such that the upper end of electrical contact 700 touches and electrically connects with bottom surface 404 of HER 128. The potential of HER 128 is conveyed to signal detector 400 by electrical signal 308.

Figure 8:
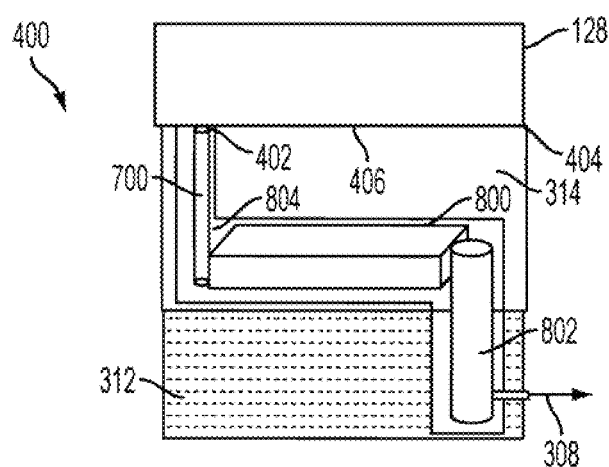
FIG. 8 illustrates another example embodiment of a signal detector in accordance with an aspect of the present invention.

FIG. 8 illustrates another example embodiment of signal detector 400 in accordance with an aspect of the present invention.

In this example embodiment, signal detector 400 includes electrical contact 700, a resistor 800 and an electrical contact 802, all disposed within a cavity 804. The lower end of electrical contact 700 is electrically connected to resistor 800. Resistor 800 is additionally electrically connected to an upper end of electrical contact 802. The potential of HER 128 is conveyed to signal detector 400 by electrical signal 308.

With further reference to FIG. 3, resistor 800 impedes arcing that may result from an impedance mismatch between impedance matching circuit 116 and wafer processing chamber 122. Particularly during system switching, it is possible to experience spurious impedance differentials between impedance matching circuit 116 and wafer processing chamber 122. These periods of impedance mismatch can induce undesirable electrical arcing within wafer processing chamber 122.

Resistor 800 reduces the magnitude of impedance differentials between impedance matching circuit 116 and wafer processing chamber 122.

Figure 9:
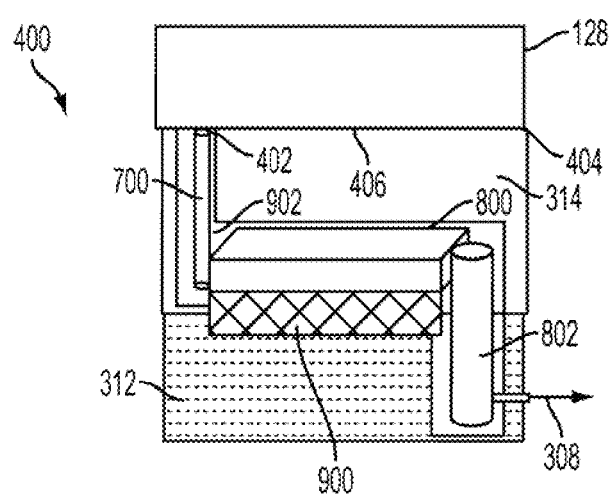
FIG. 9 illustrates another example embodiment of a signal detector in accordance with an aspect of the present invention.

FIG. 9 illustrates another example embodiment of signal detector 400 in accordance with an aspect of the present invention.

In this example embodiment, signal detector 400 includes electrical contact 700, resistor 800, electrical contact 802 and a dielectric spacer 900, all disposed within a cavity 902. Dielectric spacer 900 is disposed adjacent to resistor 800. Dielectric spacer 900 acts as a heat sink to draw heat from resistor 800. Dielectric spacer 900 should have a low value of dielectric constant to provide a high impedance, as compared to resistor 800. Such a comparatively high impedance would minimize transmission of electrical signals through dielectric spacer 900 and would maximize transmission of electrical signals through resistor 800. A non-limiting example of a material exhibiting both a low value of dielectric constant and excellent thermal conductivity is quartz.

Figure 10A:
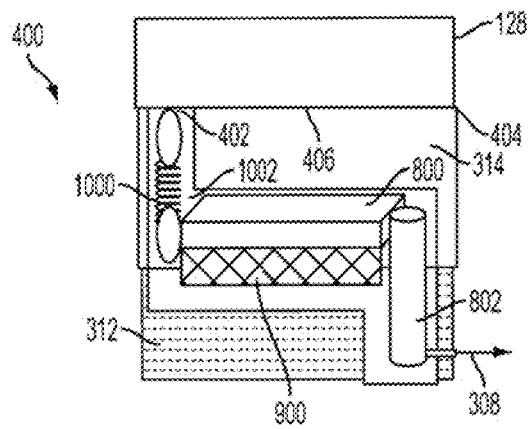
FIGS. 10A and 10B illustrate another example embodiment of a signal detector in accordance with an aspect of the present invention.
Figure 10B:
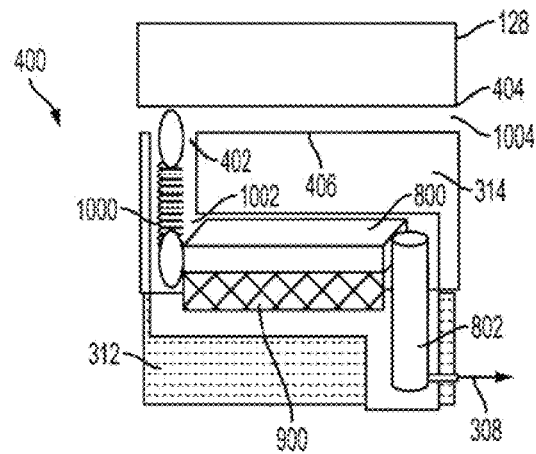

FIGS. 10A and 10B illustrate another example embodiment of signal detector 400 in accordance with an aspect of the present invention. In particular, FIG. 10A illustrates a first state of signal detector 400, when HER 128 is disposed on ceramic coupling ring 314, whereas FIG. 10b illustrates a second state of signal detector 400, when HER 128 is separated from ceramic coupling ring 314.

In this example embodiment, signal detector 400 includes a spring-loaded contact 1000, resistor 800, electrical contact 802 and dielectric spacer 900, all disposed within a cavity 1002. An upper end of spring-loaded contact 1000 is disposed at hole 402, such that the upper end of spring-loaded contact 1000 touches and electrically connects with bottom surface 404 of HER 128. A lower end of spring-loaded contact 1000 is electrically connected to resistor 800. Resistor 800 is additionally electrically connected to an upper end of electrical contact 802. The potential of HER 128 is conveyed to signal detector 400 by electrical signal 308.

FIG. 10A illustrates the operation of signal detector 400 during an operation time period $t_{op}$ of wafer processing system 300. During operation time period $t_{op}$, bottom surface 404 of HER 128 rests on top surface 406 of ceramic coupling ring 314, forcing spring-loaded contact 1000 to contract. Accordingly, signal detector 400 is able to detect a signal from HER 128.

HER 128 may have an operation lifetime, wherein HER 128 is likely to function within predetermined acceptable threshold parameters. However after the operation lifetime, HER 128 may not function within the predetermined acceptable threshold parameters as a result of wear and tear from exposure to plasma within wafer processing system 300. Accordingly, after the operation lifetime, HER 128 may need to be removed and replaced with a new HER. In the event that HER 128 needs to be removed, HER 128 may be lifted off of ceramic coupling ring 314. This will be described in greater detail below with reference to FIG. 10B.

FIG. 10B illustrates the disposition of signal detector 400 during a non-operation time period $t_{nonop}$ of wafer processing system 300. During non-operation time period $t_{nonop}$, wafer processing system 300 is turned off and signal detector 400 does not detect a signal from HER 128. HER 128 may be lifted off of ceramic coupling ring 314, wherein bottom surface 404 of HER 128 may be separated from top surface 406 of ceramic coupling ring 314, thus disconnecting spring-loaded contact 1000 from HER 128.

As illustrated in FIG. 10B, when HER 128 is separated from ceramic coupling ring 314, HER 128 will continued to be lifted away from ceramic coupling ring 314 such that a space 1004 will continue to grow and spring-loaded contact 1000 will extend through hole 402. At some time, spring-loaded contact 1000 will stop extending through hole 410. After this time, as HER 128 continues to be lifted away from ceramic coupling ring 314 and space 1004 continues to grow, spring-loaded contact 1000 will be disconnected from HER 128. In this state, spring-loaded contact 1000 does not make contact with HER 128 and does not provide an electrical path for the voltage potential from HER 128.

Once HER 128 is removed, a new HER may replace HER 128. At first, spring-loaded contact 1000 will not make contact with the new HER and will not provide an electrical path for the voltage potential from the new HER. As the new HER continues to be moved toward ceramic coupling ring 314 and space 1004 continues to decrease, spring-loaded contact 1000 will eventually contact the new HER. The new HER will continued to be moved toward ceramic coupling ring 314 such that space 1004 will continue to decrease and spring-loaded contact 1000 will compress down into hole 410. The new HER will finally be disposed onto ceramic coupling ring 314, such that the bottom surface of the new HER will rest on top surface 406 of ceramic coupling ring 314. In this situation, the bottom surface of the new HER will remain in contact with spring-loaded contact 1000. Wafer processing system 300 may then be turned on and signal detector 400 may then detect a signal from the newly-installed HER.

The benefit of the example embodiment illustrated in FIGS. 10A and 10B, is that the length of spring-loaded contact 1000 need not be as precise as the length of the contacts discussed above with reference to FIGS. 7-9. In particular, the contacts discussed above with reference to FIGS. 7-9 should be sufficiently long to contact bottom surface 404 of HER 128 through hole 410. However, the contacts discussed above with reference to FIGS. 7-9 should not be so long as to damage bottom surface 404 of HER 128. However, in the case of spring-loaded contact 1000, the length of spring-loaded contact 1000 may extend and contract to maintain contact with bottom surface 404 of HER 128 without damaging bottom surface 404 of HER 128.

In the example embodiments discuss above, a parameter of the HER is detected by contacting a bottom surface of the HER by way of a detector disposed within a ceramic coupling ring. In other embodiments, the detector is not disposed within the ceramic coupling ring, but is arranged to detect a parameter of the HER without being exposed to the plasma forming volume. A non-limiting example of such an embodiment includes the embodiment wherein the detector is disposed within the HER and is not exposed to the plasma forming volume.

In accordance with an aspect of the present invention, a HER is used as a portion of a detecting system to detect the wafer potential in a wafer processing system. Accordingly, in accordance with an aspect of the present invention, plasma-exposed probes are no longer needed, thus reducing operating and maintenance costs.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A device for use in a wafer processing chamber having a plasma forming volume, a hot edge ring, the hot edge ring having a first surface and a second surface, the first surface being in contact with the plasma forming volume, the second surface not being in contact with the plasma forming volume, said device comprising:
    a detector separated from the plasma forming volume by the hot edge ring and being operable to contact the second surface of the hot edge ring, wherein said detector comprises indium,
    wherein said detector is operable to detect a voltage of the hot edge ring and provide a detected signal based on the detected voltage.

2. The device of claim 1, further comprising:
    a coupling ring operable to contact the second surface of the hot edge ring, said coupling ring having cavity therein, the cavity having an opening facing the second surface of said hot edge ring,
    wherein said detector is disposed within the cavity and is arranged to contact the second surface of the hot edge ring.

3. The device of claim 1, further comprising:
    an output portion operable to provide an output signal based on the detected signal; and a resistor disposed between and in series with said detector and said output portion.

4. The device of claim 3, further comprising a heat sink disposed in contact with said resistor.

5. The device of claim 4, wherein said heat sink comprises quartz.

6. The device of claim 1,
    wherein said detector comprises a biasing portion and a contact portion, and
    wherein said biasing portion is operable to provide a biasing force against said contact portion to keep said contact portion in contact with the second surface of the hot edge ring.

7. The device of claim 6, wherein said biasing portion comprises a coil spring.

* * * * *